United States Patent [19]

Odenheimer

[11] Patent Number: 4,818,932
[45] Date of Patent: Apr. 4, 1989

[54] CONCURRENT MEMORY ACCESS SYSTEM

[75] Inventor: Ronald P. Odenheimer, Portland, Oreg.

[73] Assignee: Tektronix, Inc., Beaverton, Oreg.

[21] Appl. No.: 214,790

[22] Filed: Jul. 5, 1988

Related U.S. Application Data

[63] Continuation of Ser. No. 912,024, Sep. 25, 1986, abandoned.

[51] Int. Cl.⁴ .................. G01R 13/20; G01R 13/28
[52] U.S. Cl. .................. 324/121 R; 324/73 R; 340/798; 340/799
[58] Field of Search .................. 324/121 R, 73 R; 340/722, 728, 798, 799, 747; 364/200, 900

[56] References Cited

U.S. PATENT DOCUMENTS

| | | | |
|---|---|---|---|
| 3,904,959 | 9/1975 | Britton, Jr. ................. | 324/575 S |
| 4,031,520 | 6/1977 | Rohner ...................... | 364/900 |
| 4,298,931 | 11/1981 | Jachiuchi et al. ......... | 340/799 |
| 4,404,553 | 9/1983 | Cuffia ....................... | 340/728 |
| 4,435,765 | 3/1984 | Uchida et al. ............. | 364/200 |
| 4,438,493 | 3/1984 | Cushing et al. ............ | 364/200 |
| 4,496,976 | 1/1985 | Swanson et al. ........... | 340/799 |
| 4,562,435 | 12/1985 | McDonough et al. ..... | 340/798 |
| 4,624,263 | 11/1986 | Slavin ........................ | 128/710 |
| 4,634,970 | 1/1987 | Payne et al. ............... | 324/102 |
| 4,660,029 | 4/1987 | Hsuda et al. ............... | 340/747 |
| 4,673,931 | 6/1987 | Cunningham, Jr. ........ | 340/722 |

FOREIGN PATENT DOCUMENTS

| | | | |
|---|---|---|---|
| 0080146 | 6/1980 | Japan ........................ | 340/798 |
| 0031675 | 2/1985 | Japan ........................ | 340/799 |
| 2155670 | 9/1985 | United Kingdom ....... | 340/799 |

Primary Examiner—Reinhard J. Eisenzopf
Assistant Examiner—W. Burns
Attorney, Agent, or Firm—Daniel J. Bedell; Francis I. Gray; Peter J. Meza

[57] ABSTRACT

A system for providing concurrent access to an addressable memory space by a plurality of data processing devices includes a plurality of independently accessible memory banks, each memory bank providing a separate portion of the addressable memory space. A memory management unit includes address and data multiplexers corresponding to each memory bank for providing access by any selected one of the data processing devices to the corresponding memory bank and also includes circuits for controlling the multiplexers to permit different processing devices to access different memory banks at the same time while arbitrating competing demands for the same memory bank.

9 Claims, 8 Drawing Sheets

CONCURRENT MEMORY ACCESS SYSTEM

This is a continuation of application Ser. No. 912,024 filed Sept. 25, 1986, now abandoned.

BACKGROUND OF THE INVENTION

The present invention relates in general to memory controllers and in particular to a method and apparatus for providing concurrent access to a memory by a plurality of data processing devices.

A typical digital oscilloscope includes a digitizer for sampling input waveforms and converting the samples into digital waveform data for storage in a random access waveform memory. Thereafter the waveform data is read out of the waveform memory and transmitted to a display controller which displays the data as a waveform on an oscilloscope screen. Some digital oscilloscopes include microprocessors which may also access the waveform memory for various purposes. For instance a microprocessor may be programmed to read from the waveform memory data sequences representing two waveforms, sum the two sequences to form a third data sequence, and then store the third data sequence in the waveform memory. The third data sequence may be transmitted from the waveform memory to the display controller for display as a "processed" waveform on the screen, the processed waveform representing the sum of the two digitized waveforms.

In such a digital oscilloscope system the digitizer, the display controller, and the microprocessor all access the same waveform memory, and the speed of response of the oscilloscope's display to a change in an input waveform can be limited by the competing demands for access to the waveform memory. What is needed and would be useful is a system for reducing competition for access to a random access memory by a plurality of data processing devices.

SUMMARY OF THE INVENTION

According to one aspect of the invention, in a system for providing concurrent access to a random access memory (RAM) by a plurality of data processing devices, the RAM is organized into a set of independently accessible memory banks, each bank having its own data, address and control lines and each bank providing a separate portion of the address space of the RAM. Interface ports corresponding to each data processing device provide addressing for memory bank access and generate memory access request signals indicating which bank is to be accessed by the corresponding data processing device. Data and address multiplexers associated with each memory bank selectively connect data and address lines from any one of the interface ports to address and control lines of the associated memory bank. A separate memory bank control circuit for each bank arbitrates access to the bank in response to the request signals generated by the interface ports by controlling the switching states of the address and data multiplexers for the associated bank. In this arrangement separate data processing devices may each access different memory banks at the same time.

In accordance with the preferred embodiment of the invention, the random access memory is organized into two memory banks, an "odd" bank including all of the odd RAM addresses and an "even" bank including all of the even RAM addresses, an address being "odd" or "even" according to the state of the least significant bit of the address of the memory location to be accessed. When two processing devices each attempt to read or write sequences of data to contiguous sequences of memory addresses, the arbitrators control access to the banks in an alternating fashion such that during one memory access cycle, a first processing device accesses the odd bank while a second processing device accesses the even bank, and during a next memory access cycle, the first accesses the even bank while the second processing device accesses the odd bank. Thus each processing device is able to read (or write) a data sequence from (or to) sequential memory addresses without substantially interfering with the rate at which the other device reads (or writes) a data sequence from (or to) the memory. Thus the division of the memory into two or more independently accessible banks provides a substantial reduction in waiting time for processing devices competing for access to the memory.

It is accordingly an object of the invention to provide a new and improved system for providing concurrent access to a random access memory for a plurality of digital data processing devices.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DRAWINGS

DETAILED DESCRIPTION

Figure 1:
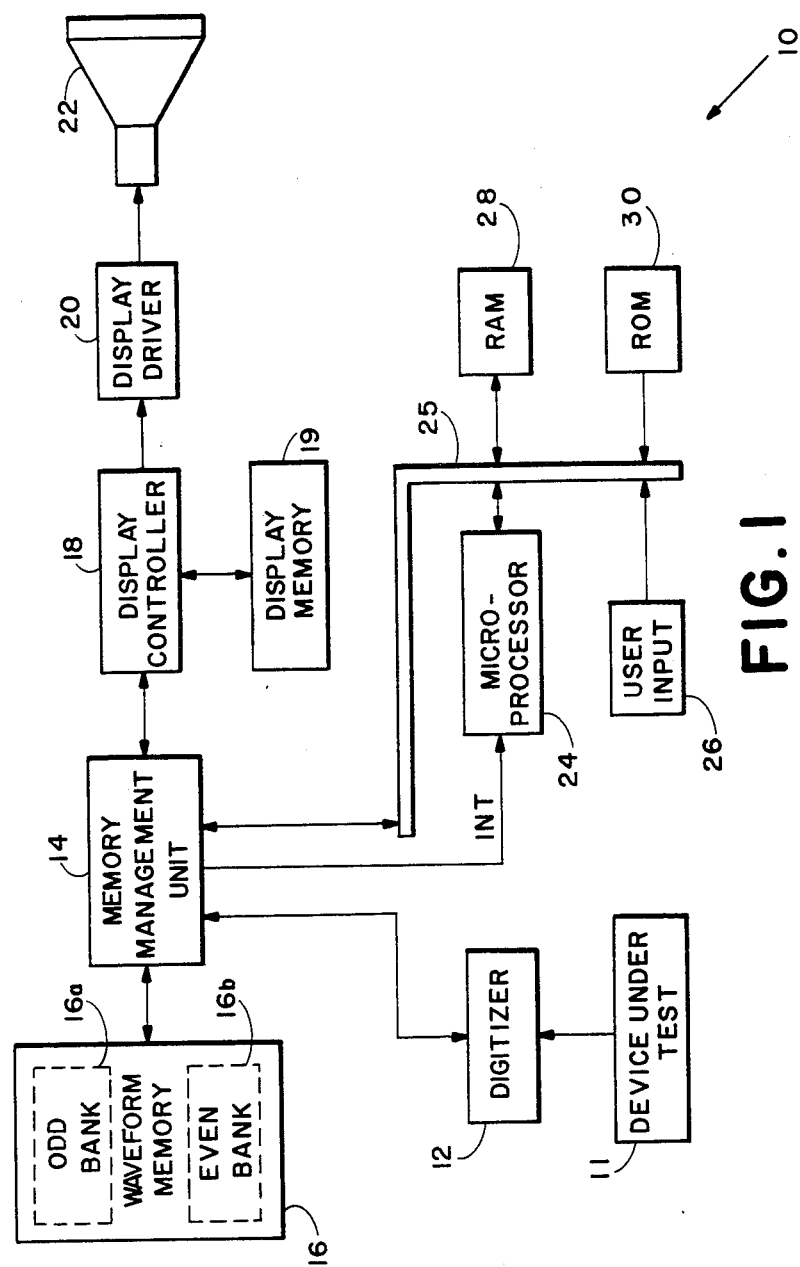
FIG. 1 is a block diagram of a digital oscilloscope utilizing the present invention.

Referring to FIG. 1, a computer-based digital oscilloscope 10 shown in block diagram form includes a digitizer 12 which samples and digitizes analog waveforms from a device under test 11 and transmits digitized data sequences representing the analog waveforms to a memory management unit (MMU) 14. The MMU 14 stores the waveform data sequences in a random access waveform memory 16 and subsequently transmits waveform data stored in waveform memory 16 to a display controller 18. The display controller 18 converts the incoming waveform data into display control data, stores the display control data in a display memory 19, and periodically transmits the stored display control data to a display driver 20 which controls the display of the data as waveforms on a cathode ray tube 22.

A microprocessor 24 communicates with digitizer 12, MMU 14 and display controller 18 based on commands from a user via user input devices 26 such as a keyboard, control knobs and the like, connected to the microprocessor 24 through a computer bus 25. A random access memory (RAM) 28, and a read only memory (ROM) 30 are also connected to bus 25. The ROM 30 contains program instructions for controlling the operation of microprocessor 24 which utilizes RAM 28 for temporary data storage.

The digitizer 12 simultaneously samples up to 14 different waveforms produced by the device under test 11 and transmits sample data sequences to MMU 14 which stores the data sequences at separate sets of contiguous addresses in waveform memory 16. Waveform memory 16 is large enough (for example one half megabyte) to store waveform sample data representing several hundred previously digitized waveforms. The oscilloscope 10 simultaneously displays up to eight different waveforms based on selected waveform data stored in the waveform memory 16.

Microprocessor 24 transmits control data to MMU 14 indicating where in the waveform memory 16 the incoming waveform data sequences from the digitizer 12 are to be stored, what waveform data sequences in waveform memory 16 are to be transmitted to display controller 18, and when waveform data is to be transmitted to the display controller to update the waveform display on screen 22. The microprocessor 24 also provides graphical and text display information to display controller 18 via MMU 14 causing the display controller 18 to display graphics and text information on CRT 22 in conjunction with the waveform displays. The microprocessor 24 communicates with digitizer 12 via memory management unit 14 in order to adjust operating parameters of the digitizer and to tell the digitizer what waveform memory 16 addresses are to receive the waveform data sequences produced by the digitizer.

The microprocessor 24 generates "processed" waveform data sequences representing simulated waveforms in the same way that sequences of data from digitizer 12 represent real waveform inputs to digitizer 12. The microprocessor 24 computes the value of each datum in a processed waveform data sequence according to a mathematical expression specified by a user through user input devices 26. The mathematical expression may utilize the values of selected digitized or processed waveform data stored in waveform memory 16 as independent variables, may utilize integer and floating point constants having values set by control knobs or other input devices 26, and may make use of a function library stored in ROM 30, the library including such mathematical functions as addition, subtraction, multiplication, division, roots and powers, trignometric functions, and the like. Microprocessor 24 may simultaneously produce data sequences for up to eight processed waveforms, each computed according to a separate user defined mathematical expression, the data sequences being transmitted to the MMU 14 in an interleaved fashion. MMU 14 stores the sequences in memory 16 for subsequent transmission to display controller 18 for display as waveforms on CRT 22.

As can be seen from the foregoing description of the digital oscilloscope system 10 of FIG. 1, the digitizer 12, the display controller 18 and the microprocessor 24 all have competing demands for access to the waveform memory 16. For example at the same time digitizer 12 wishes to transmit digitized waveform data for storage in the waveform memory 16, the microprocessor 24 may want to transmit processed waveform data for storage in the memory, and the display controller 18 may want to read data out of the memory. These competing demands for memory access can limit the real time performance of the oscilloscope in terms of its ability to rapidly generate, store and display waveform data. Memory management unit 14 is provided to arbitrate these competing demands for memory access from digitizer 12, display controller 18, and microprocessor 24. Moreover, memory 16 and MMU 14 are adapted to permit concurrent access to the waveform memory 16 by any two of these devices during a single memory access cycle, thereby improving the real time performance of the oscilloscope.

The waveform memory 16 is organized into an "odd" bank 16a for storing data at all of the "odd" memory addresses of the memory address space provided by the waveform memory and an "even" bank 16b for storing data in all of the "even" memory addresses of the memory address space. The state (logical 1 or 0) of the least significant bit of the memory address determines whether an address is "odd" or "even". Each bank is independently accessible in the sense that each communicates independently with the MMU 14 through separate data, address and control lines. When a data processing device (such as digitizer 12, display controller 18 or microprocessor 24) writes or reads a data word sequence to or from contiguous sequences of memory addresses, the banks 16a and 16b are accessed in an alternating fashion. For example when a first data word of a sequence is written to an odd address in the odd memory bank 16a, a second data word is written to the next higher (even) address in the even memory bank 16b, the third data word of the sequence is written to the next higher address in the odd bank 16a, and so on. When two data processing devices attempt to write data into the waveform memory 16 at the same time, the MMU 14 controls access to the even and odd banks such that during one memory access cycle, a first data processing device writes to the odd bank 16a, while a second data processing device writes to the even bank 16b and during a next memory access cycle, the first data processing device writes to the even bank while the second data processing device writes to the odd bank. In this arrangement each data processing device is able to write a data sequence into (or read a data sequence out of) memory 16 without substantially interfering with the rate at which the other device writes a data sequence into (or reads a data sequence out of) the memory.

Even when two data processing devices concurrently attempt to access series of random waveform memory 16 locations rather than sequences of contiguous memory locations, there is approximately a 50% chance that the memory locations to be accessed during any given memory access cycle are in different banks, so that on average each data processing device can access the memory 16 more often than when only a single data processing device can access memory 16 at any one time. Thus the division of the memory into two or more independently accessible banks provides a substantial reduction in waiting time for processing devices competing for access to the memory. The more banks provided, the greater the reduction in average waiting time.

Figure 2:
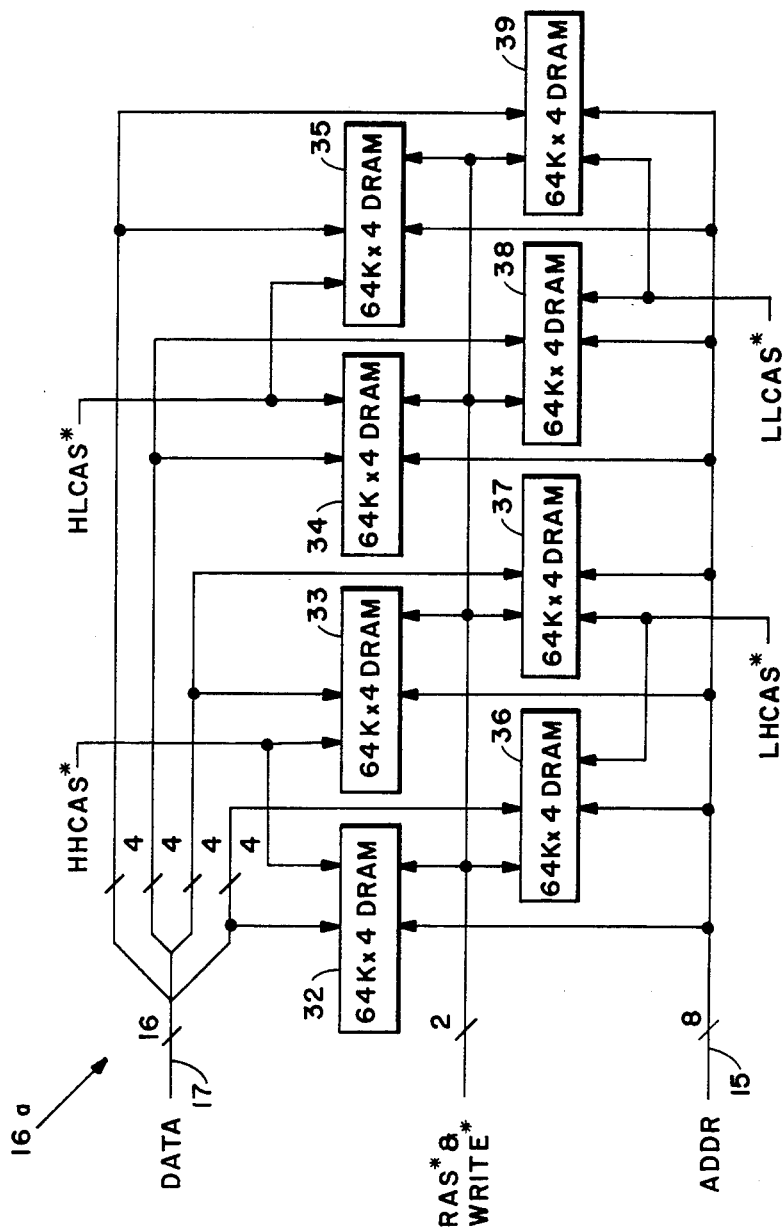
FIG. 2 is a block diagram of the odd bank of the waveform memory of FIG. 1.

In the preferred embodiment of the invention, each bank 16a and 16b provides for storage of 256K sixteen bit words. Referring to FIG. 2, the odd bank 16a of the waveform memory 16 of FIG. 1 is depicted in more detailed block diagram. (The even bank 16b of the waveform memory has substantially identical topology to the odd bank and is not further detailed herein.) The odd bank 16a includes a set of four pairs of 64K×4 bit dynamic random access memory chips (DRAM's) 32/33, 34/35, 36/37 and 38/39. An eight bit address bus 15 and eight bits of a sixteen bit data bus are applied to address and data terminals of each DRAM pair. An inverted row address strobe (RAS) signal RAS* (the * symbol indicates an active low signal) and an inverted write strobe signal WRITE* from the MMU 14 of FIG. 1 are applied to write control and RAS inputs of each DRAM. A column address strobe (CAS) signal HHCAS* controls CAS inputs of DRAM pair 32/33 while other inverted CAS signals HLCAS*, LHCAS*, and LLCAS* control the CAS inputs of DRAM pairs 34/35, 36/37, and 38/39 respectively.

An eight bit data word may be written into (or read from) a selected address in any DRAM pair in a single memory write (or read) operation by placing the 8 bit word on eight lines of the data bus 17 connected to the pair, setting the WRITE* signal for a read or write operation, placing the first eight bits of the address on the address bus 15, asserting the RAS* signal, placing the second eight bits of the selected address on the address bus, and then asserting the appropriate CAS signal. A sixteen bit data word may be written into (or read from) a selected address in two DRAM pairs following a similar procedure except that a sixteen bit data word rather than an eight bit data word is placed on the sixteen bit data bus 17 leading to the DRAM pairs and CAS signals controlling the two DRAM pairs being simultaneously asserted.

Referring again to FIG. 1, the microprocessor 24 may read or write either eight or sixteen bit data words in memory 16. In order for the microprocessor 24 to access a particular eight bit waveform memory 16 location it must provide the MMU 14 with at least 19 address bits. One address bit indicates whether the odd bank or the even bank is to be accessed, two bits indicate which pair of DRAMs are being accessed (i.e., which of four CAS signals is to be asserted), eight bits determine the row address of the selected DRAM storage location to be accessed and another eight bits determine the column address of the DRAM storage location. The digitizer 12 and the display controller 18 access the memory using 16 bit words and only 18 address bits are needed, since only a single bit is required to determine which pair of the two pairs of CAS lines (HHCAS* and HLCAS* or LHCAS* and LLCAS*) are to be strobed.

Figure 3:
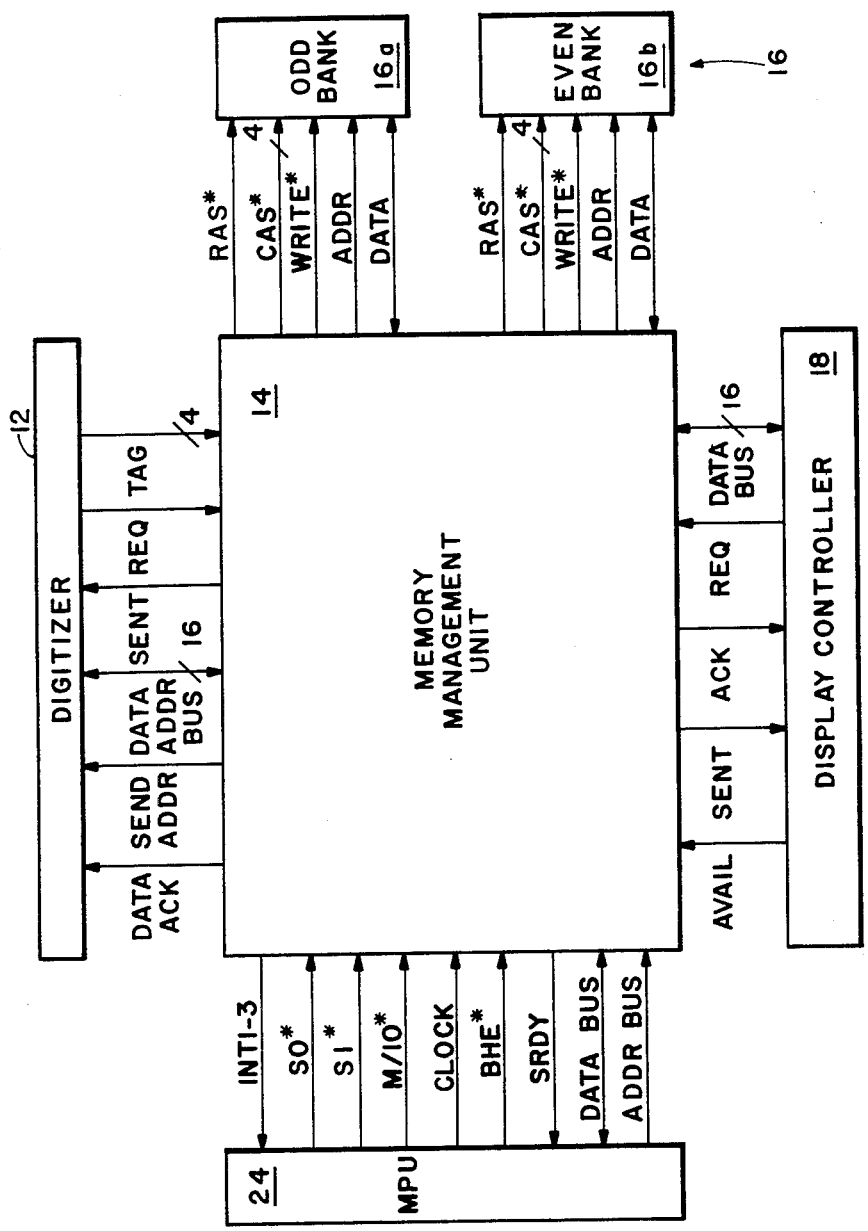
FIG. 3 is a block diagram showing interconnections between the memory management unit, and the waveform memory, the microprocessor, the display controller, and the digitizer of FIG. 1.

Referring to FIG. 3, the control, data and address lines interconnecting the MMU 14 to the odd bank 16a, the even bank 16b, the digitizer 12, the display controller 18 and the microprocessor 24 of FIG. 1 are shown in more detail. The digitizer 12 transmits data and addresses to the MMU 14 through a common sixteen bit data/address, bus. When the digitizer 12 is ready to send a sixteen bit data word to the MMU 14 for storage in one of the memory banks, it transmits a request signal (REQ) to the MMU 14. When the MMU 14 is ready to receive the address from the digitizer 12, it transmits a SEND ADDR signal to the digitizer causing the digitizer to place the address on the address/data bus. On the trailing edge of the SEND ADDR signal, the MMU 14 stores the address in an internal register and transmits an acknowledge signal (DATA ACK) to the digitizer 12. On receipt of the DATA ACK signal, the digitizer 12 places a sixteen bit data word on the bus. On the trailing edge of the DATA ACK signal the MMU 14 stores the data in another internal register. At this point the digitizer 12 may request another data transmission if it has another data word to transmit.

The digitizer 12 provides only a sixteen bit address with each data transmission to the MMU 14 but 18 address bits are required to indicate the location in memory 16 where the data is to be stored. The additional address bits are supplied by the MMU 14 prior to accessing the waveform memory. The digitizer may write data into any of fourteen predetermined areas of the waveform memory 16 and the sixteen address bits provided by the digitizer are utilized to determine the specific address within a particular predetermined memory area at which a data word is to be stored. The memory area to receive the data is indicated by four bit "TAG" data provided to the MMU 14 by the digitizer 12 with the 16 bit address. The particular areas in memory are predetermined by data provided to the MMU 14 by the microprocessor 24 in a manner described hereinbelow.

When the MMU 14 has control data to send to the digitizer 12, and the digitizer is not currently requesting to transmit data to the MMU, the MMU places the data on the data/address bus and asserts a SENT signal to the digitizer causing the digitizer 12 to read the data on the bus.

The display controller 18 acquires waveform and graphics data and messages stored in the waveform memory 16 via the memory management unit 14. In response to commands from the microprocessor 24, the display controller 18 may also write data into the waveform memory 16 via the MMU 14 for later access by the microprocessor. This feature is useful, for instance, in performing a "screen dump" wherein the microprocessor 24 requests the display controller to store the current contents of the display memory 19 of FIG. 1 in the waveform memory so that the microprocessor may later acquire the display data and cause a printer which may also be connected to bus 25 of FIG. 1 to print an image of the screen display.

The timing and flow of data between the waveform memory 16 and the display controller 18 of FIG. 3, and the production of the appropriate memory addresses for storage of the data are controlled by the MMU 14 according to information provided by the microprocessor 24. When the display controller 18 is free to receive waveform, graphics or message data stored in memory 16, it transmits an AVAIL signal to the MMU 14. Thereafter, when the MMU 14 is ready to transmit a 16 bit data word to the display controller 18, it places the data in memory on a data bus to the display controller and transmits a SENT signal to the display controller causing the display controller to read the data on the bus. When the display controller 18 wants to transmit data to the MMU 14 for storage in the waveform memory, it places the data on the data bus and sends a request (REQ) signal to the MMU. When the MMU 14 subsequently stores the data in memory 16 at a predetermined memory address, it asserts an acknowledge signal (ACK) to the display controller 18 to indicate receipt of the data.

In the preferred embodiment of the invention, the microprocessor 24 is an Intel model 80826 which communicates with the MMU 14 via a 16 bit data bus, a 23 bit address bus and a number of control and interrupt lines. Communication between the microprocessor 24 and the MMU 14 is synchronized by a CLOCK signal provided by the microprocessor 24. When the microprocessor 24 wishes to write data to the waveform memory 16, it places a memory address on its address bus and the data on its data bus to the MMU 14 and asserts an "S0*" control line to the MMU which causes the MMU 14 to read the address and data from the microprocessor 24 and to deassert an SRDY line to the microprocessor. When the MMU 14 subsequently stores the data in the waveform memory 16, it asserts the SRDY line to the microprocessor.

When the microprocessor 24 wants to read data out of the waveform memory 16, it places the address of the data on the address bus and asserts an S1* control line to the MMU 14. This causes the MMU to deassert the SRDY line, to acquire the addressed data from the waveform memory 16, to place the acquired data on the data bus to the microprocessor 24, and to reassert the SRDY line. When the SRDY line is reasserted, the microprocessor 24 reads the data on the data bus. During a memory read or write operation, the microprocessor 24 may access the waveform memory 16 utilizing either eight or sixteen bit data words. When it utilizes only eight bit data words, the microprocessor asserts a byte high enable (BHE*) signal to the MMU 14.

The microprocessor 24 may also write data into various addressable registers within the MMU 14. As discussed in more detail hereinbelow, the data stored in these registers controls the generation of memory addresses when the digitizer 12 and the display controller 18 access the waveform memory 16 during transfer of waveform, graphics or display data between the waveform memory 16 and the display controller 18 and during transfer of instruction data from the waveform memory to the digitizer 12. The microprocessor 24 writes data into these registers by placing the data on the data bus and a register address on the address bus and then deasserting an M/IO* signal while asserting the S0* signal. Deassertion of the M/IO* signal indicates to the MMU 14 that the data on the data bus is to be written into a register rather than to the waveform memory 16 and that the address on the address bus indicates the register to receive the data. The MMU 14 also controls three interrupt inputs (INT1-3) to microprocessor 24. INT1 indicates to the microprocessor 24 that the digitizer 12 has a message to send to the microprocessor. Interrupt INT2 indicates that a data transmission sequence to or from the display controller 18 or to the digitizer 12 has been completed and interrupt INT3 indicates that the display controller has requested to transmit data. These interrupts are discussed in more detail hereinbelow.

Figure 4:
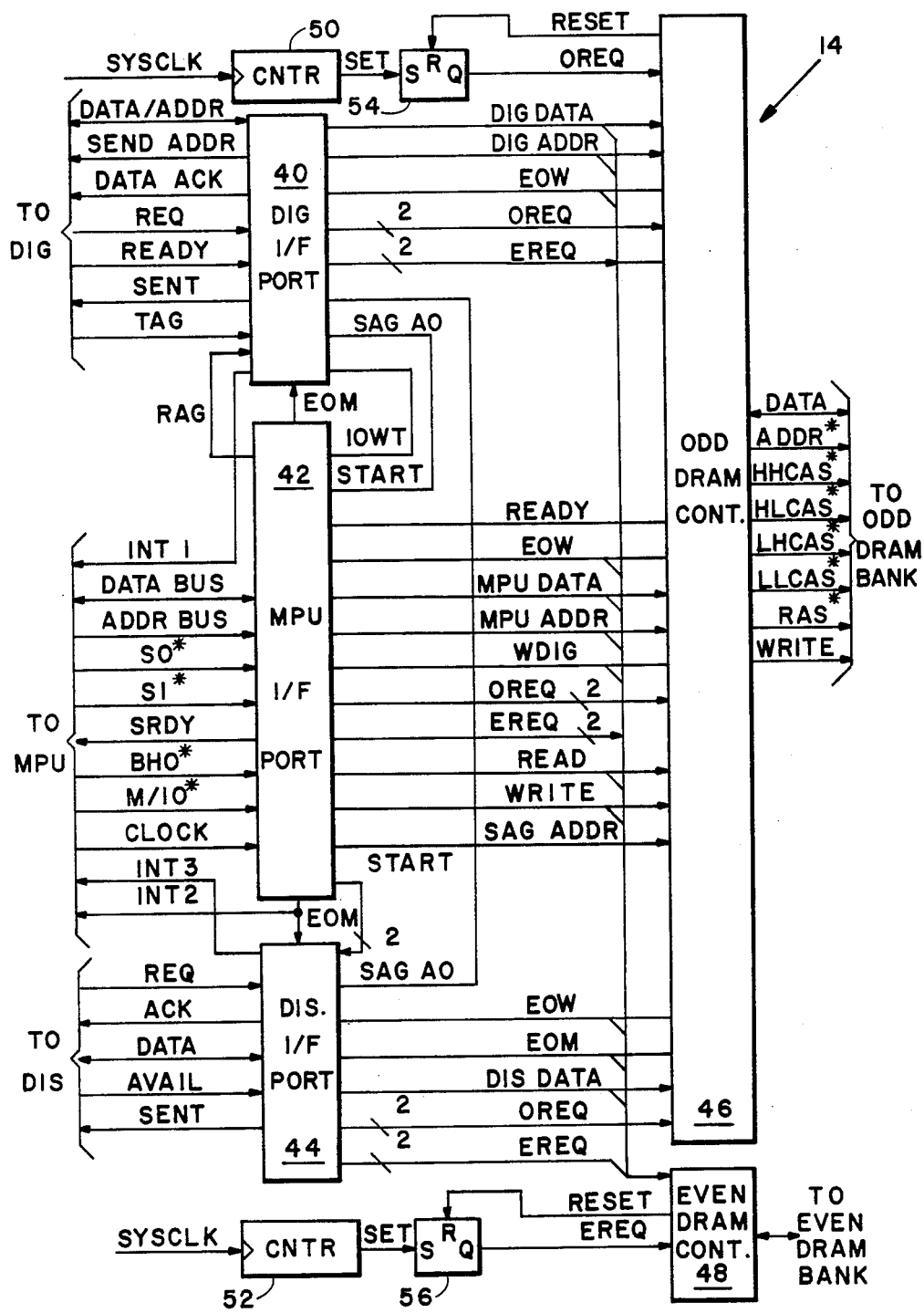
FIG. 4 is a more detailed block diagram of the memory management unit 14 of FIG. 3.

Referring to FIG. 4, the MMU 14 of FIGS. 1 and 3, shown in block diagram form, includes a set of three interface ports and a pair of DRAM controllers. A digitizer interface port 40 provides communication with the digitizer 12 of FIG. 1, a microprocessor (MPU) interface port 42 provides communication with the microprocessor 24 of FIG. 1, and a display interface port 44 provides communication with the display controller 18 of FIG. 1. An "odd" DRAM controller 46 controls access to the odd DRAM bank 16a of FIG. 1 while an "even" DRAM controller 48 controls access to the even DRAM bank 16b of FIG. 1.

When the digitizer transmits a request (REQ) to write a waveform data word to memory 16, the digitizer interface port 40 looks at the least significant bit of the memory address at which the data is to be stored to determine whether the data word is to be stored in the even DRAM bank or in the odd DRAM bank. The digitizer interface port 40 transmits a two bit "odd request" signal (OREQ) to the odd DRAM controller and a two bit "even request" signal (EREQ) to the even DRAM controller 48. The state of one of the two bits of the OREQ and EREQ signals indicates whether the digitizer is requesting a memory read access and the state of the other bit indicates whether the digitizer is indicating a memory write access.

When the microprocessor asserts the S0* signal to initiate a memory write operation, the microprocessor interface port 42 determines from the address provided by the microprocessor whether the data is to be stored in the even or in the odd bank and transmits appropriate single bit EREQ and OREQ signals to the even and odd DRAM controllers 46 and 48 indicating which memory bank is to receive the data. The microprocessor interface port 42 also includes a "sequential address generator" (SAG) adapted to generate a sequence of addresses starting and ending with addresses provided as data from the microprocessor and stored in registers in the microprocessor interface port 42. This address sequence is utilized to address the waveform memory when a stored data sequence is to be transmitted to the digitizer. Each time the SAG generates an address, the least significant bit (A0) of the SAG address is transmitted to the digitizer interface port 40 which determines from the A0 bit which DRAM bank is to be addressed and sets the bits of the EREQ and OREQ signals accordingly.

The SAG may also be utilized to address the waveform memory 16 when data is read out the waveform memory for transmission to the display controller 18 of FIG. 1 or when data from the display controller is written into the waveform memory. Accordingly, the least significant bit A0 of the SAG address is also provided to the display interface port 44 which determines from the A0 bit whether the even or odd bank is to be accessed and sets the bit states of two bit OREQ and EREQ signals transmitted to the odd and even DRAM controllers 46 and 48 to indicate which bank is being addressed and whether a read or a write operation is intended. To indicate when a memory access utilizing a SAG address is complete, the DRAM controller transmits an "end of word" (EOW) signal to each interface port.

The MMU 14 also includes a pair of counters 50 and 52 each of which counts cycles of a system clock (SYSCLK) and produces an output pulse after every N SYSCLK cycles. The output pulse of counter 50 sets a flip-flop 54 while the output pulse of counter 52 sets another flip-flop 56. The Q output of flip-flop 54 is applied as an OREQ input to the odd DRAM controller 46 and causes the odd DRAM controller to initiate a waveform memory refresh operation for the odd DRAM bank. Similarly the Q output of flip-flop 56 is applied as an EREQ input to even DRAM controller 48 and causes the even DRAM controller to initiate a memory refresh operation for the even DRAM bank. After a DRAM controller has initiated a refresh operation, it transmits a signal to reset the flip-flop which sent the refresh request.

The DRAM controllers 46 and 48 each contain arbitration circuits which monitor the OREQ and EREQ signals from flip-flops 54 and 56 and from interface ports 40, 42 and 44 and arbitrate read, write and refresh access to the associated DRAM bank when multiple requests for access are received. Whenever a memory bank access is completed, the DRAM controller for the bank checks the states of all the request signals and honors requests in order of priority. A memory refresh request is given highest priority, an access request for a message to the digitizer 12 of FIG. 1 is given next highest priority, and all other access requests share least highest priority in alternating fashion. When the digitizer and display interface ports each request access to the same memory bank, the DRAM controller for the bank alternately grants memory access to each interface port.

Each DRAM controller 46 and 48 includes a data multiplexing circuit which selectively connects a data bus from the digitizer interface port 40 (DIG DATA), from the microprocessor interface port 42 (MPU DATA) or from the display interface port 44 (DIS DATA) to the data lines of the associated DRAM bank. Each DRAM controller also includes an address multiplexing circuit which connects the eight address lines of the DRAM bank to eight lines of either a digitizer address bus (DIG ADDR) from the digitizer interface port 40, the microprocessor address bus (MPU ADDR) from the microprocessor interface port 42, or a SAG address bus (SAG ADDR) from the microprocessor interface port 42. When a DRAM controller grants an access request to an interface port, it connects the appropriate data and address lines from the requesting interface port to the DRAM bank, and transmits the appropriate RAS*, CAS* and WRITE* signals to accomplish the requested memory access.

Figure 5:
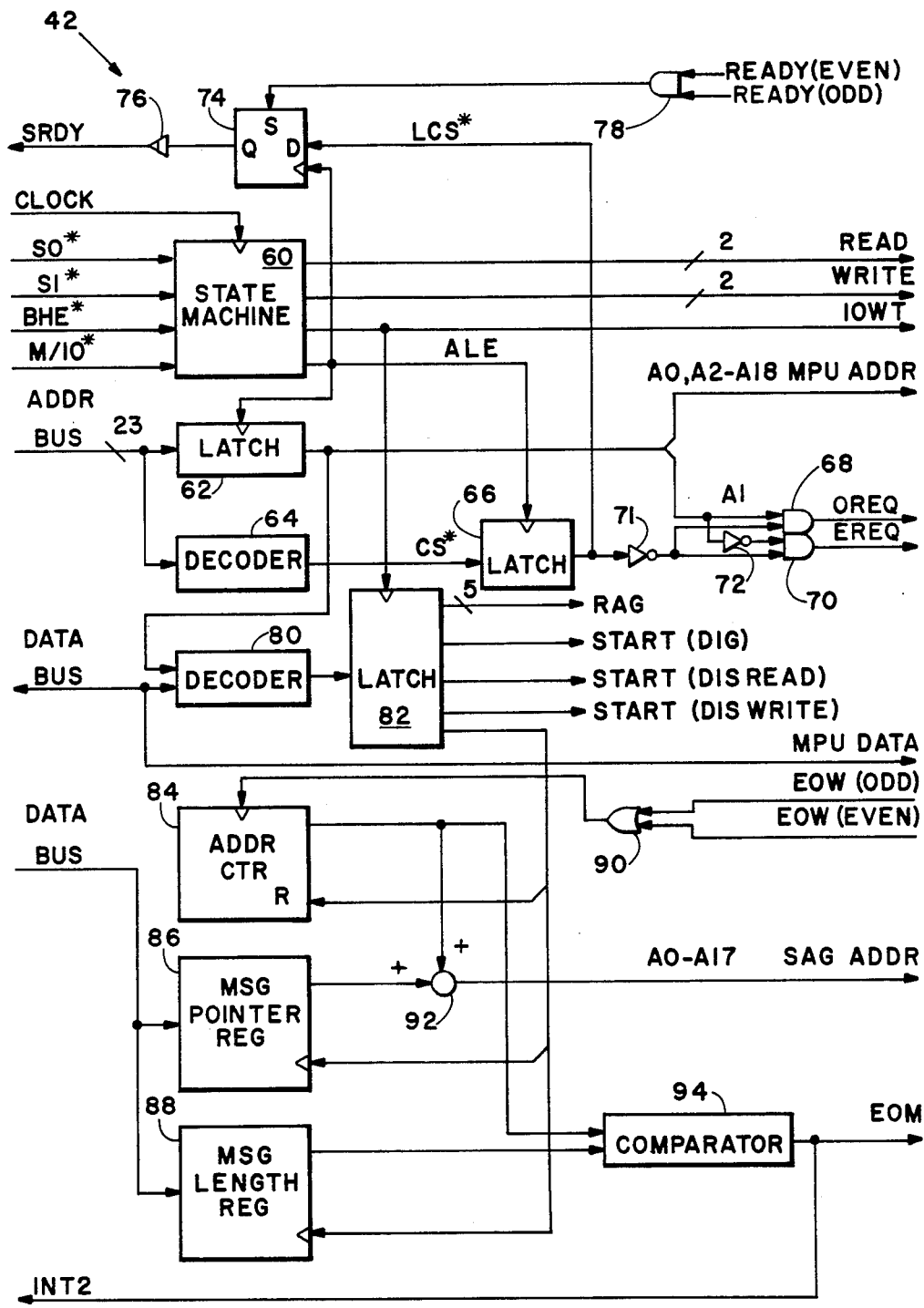
FIG. 5 is a more detailed block diagram of the microprocessor interface port of FIG. 4.

Referring to FIG. 5, the microprocessor interface port 42 of FIG. 4, depicted in more detailed block diagram form, includes a state machine 60 for receiving the S0*, S1*, BHE* and M/IO* control signals from the microprocessor 24, the state machine being clocked by the CLOCK signal from the microprocessor. When the state machine 60 determines from these control signal inputs that the microprocessor wants a memory read or write access, the state machine sets the state of a two bit READ signal and a two bit WRITE signal transmitted to each DRAM controller to indicate whether an eight bit or sixteen bit data word is to be read or written. At the same time, the state machine 60 generates an address latch enable signal (ALE) which causes a latch 62 to latch 19 bits of a 23 bit address on the address bus from the microprocessor onto the address lines (MPU ADDR) to both DRAM controllers. The 23 bit address on the address bus from the microprocessor is also applied to a decoder circuit 64 which produces an output bit CS* indicating whether the address on the address bus is within the address space provided by the waveform memory. The CS* bit is latched by another latch 66 also in response to the ALE signal from state machine 60.

Address bits A0 and A18 from the microprocessor indicate which of the four CAS* signals the DRAM controller is to generate, bits A2–A17 provide the sixteen bit DRAM address utilized to access memory locations in a DRAM bank, and bit A1 determines whether the even or odd DRAM bank is to be accessed. Bit A1 provides an input to an AND gate 68 and, through an inverter 72, to another AND gate 70. The content LCS* of latch 66, inverted by another inverter 71, provides another input to each AND gate 68 and 70. When A1 is high and the LCS* bit is low, the microprocessor is attempting to access an odd memory address within the waveform memory and the output of AND gate 68 is driven high to produce an OREQ signal transmitted to the odd DRAM controller 46 of FIG. 4. When the A1 and LCS* bits are low, the microprocessor is attempting to access an even memory address within the waveform memory and the output of AND gate 70 is driven high to produce an EREQ signal transmitted to the even DRAM controller. The LCS* signal inhibits the EREQ and OREQ signals when the microprocessor is attempting to access address space other than that provided by the waveform memory, such as provided by RAM 28 or ROM 30 of FIG. 1.

The LCS* signal is also applied to a D input of a type D flip-flop 74 which is clocked by the ALE signal from the state machine 60. The Q output of flip-flop 74 drives an open collector buffer 76 which produces the SRDY signal transmitted to the microprocessor. As previously discussed, the SRDY signal is deasserted when the MMU is in the process of carrying out a memory read or write request from the microprocessor. At all other times the SRDY signal is asserted. "READY" signals generated by the even and odd DRAM controllers when they are not currently performing a memory access for the microprocessor are combined by an AND gate 78 to provide a signal for setting flip-flop 74. When neither DRAM controller is currently performing a memory access for the microprocessor, the READY signals are both set high, driving the output of AND gate 78 high, thereby setting flip-flop 74 and asserting the SRDY signal to the microprocessor to indicate that the interface port 42 is available for transmitting or receiving more data to or from the microprocessor. Thereafter, when the microprocessor decides to access the waveform memory, it places a waveform memory address on the address bus and that address is decoded by decoder 64 to produce the CS* signal latched into latch 66. The LCS* output of latch 66 is driven low, which in turn drives the Q output of flip-flop 74 low to deassert the SRDY signal.

The microprocessor interface port 42 also includes a decoder 80 which decodes the incoming data on the data bus from the microprocessor and the incoming address latched by latch 62 to provide eleven output signals to a latch 82. When the state machine 60 determines from its M/IO* control signal input from the microprocessor that the microprocessor is attempting to access IO space rather than memory space, it transmits an IO write signal (IOWT) to latch 82 causing it to latch the eleven signal outputs of decoder 80. The function of each latched output signal of decoder 80 is described hereinbelow.

The sequential address generator (SAG) portion of microprocessor interface port 42 includes an address counter 84, a message pointer register 86 and a message length register 88. The data bus from the microprocessor provides data input to registers 86 and 88. Three of the output signals of decoder 80 are utilized to reset counter 84 and to control the loading of data into registers 86 and 88. When the microprocessor wishes to initiate a transfer of a data sequence from the waveform memory to the digitizer or to the display controller, or when the microprocessor wishes to initiate a data sequence transfer from the display controller to the waveform memory, it utilizes three IO write operations. In a first IO write operation it stores the waveform memory address for the first word of the data sequence in the message pointer register 86. In a second IO write operation it stores data indicating the number of words in the sequence in message length register 88, and in a third IO write operation it resets the count of address counter 84 to zero. Each time one of the DRAM controllers completes a memory access utilizing a SAG address, it transmits an "end of word" (EOW) signal to the microprocessor interface port 42. The EOW signals from the even and odd DRAM controllers are combined by an OR gate 90 and the output of the OR gate drives the count input of counter 84. Thus counter 84 maintains a count of the number of words of the data sequence which have been written into or read out of the waveform memory. The count maintained by the address counter 84 and the starting address stored in message pointer register 86 are summed by a summing circuit 92 to produce the 18 bit SAG address (A0-A17). A comparator 94 compares the message length data stored in register 88 to the count maintained by counter 84 and transmits an "end of message" (EOM) signal to the digitizer and display interface ports when the count reaches the message limit to tell these ports that the data transfer has ended. The EOM signal is also transmitted back to the microprocessor as interrupt INT2 signal to tell the microprocessor that the data sequence transfer is complete.

Figure 6:
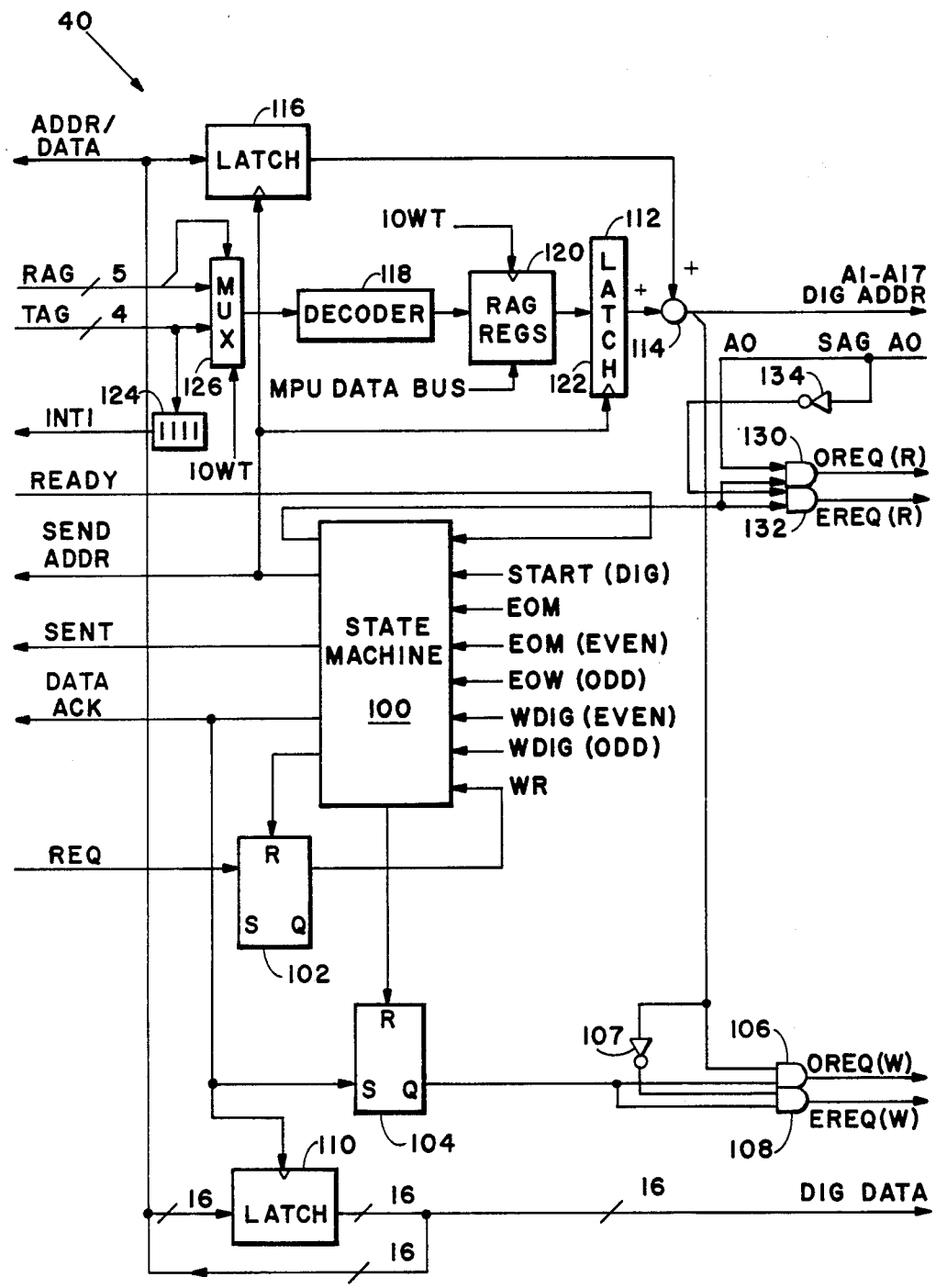
FIG. 6 is a more detailed block diagram of the digitizer interface port of FIG. 4.

Referring to FIG. 6, the digitizer interface port 40 of FIG. 4, depicted in more detailed block diagram form, includes a state machine 100 for arbitrating competing demands for use of the sixteen bit data/address bus between the digitizer 12 and the MMU 14 of FIG. 3. The REQ signal sent by the digitizer to request a memory write operation sets a flip-flop 102 and the Q output of the flip-flop is provided as one input (WR) to state machine 100. "WDIG" signals generated by the even and odd DRAM controllers when they are currently performing a memory write access in response to a digitizer request are also provided as inputs to state machine 100 along with end of word signals (EOW) generated by the even and odd DRAM controllers upon completion of a memory access, a START signal generated by the microprocessor interface port 42 of FIG. 5 in order to initiate a data transfer from the waveform memory to the digitizer, and the end of message (EOM) signal generated by the microprocessor interface port at the end of a SAG sequence.

When the digitizer desires to write data to the waveform memory, it places a sixteen bit address on the data/address bus and asserts the appropriate TAG lines. The TAG data on the TAG lines is transmitted through a multiplexer 126 to a decoder 118 which selects one of fourteen "random address generator" (RAG) registers 120, each of which stores the base address of a different waveform storage area in the waveform memory. Each RAG register is preloaded by data carried on the data bus from the microprocessor when addressed by four bits of a five bit RAG signal produced by the decoder 80 of the microprocessor interface port 42 of FIG. 5 when the RAG registers are write enabled by the IOWT signal generated by the microprocessor interface port during an IO write operation. The four register addressing bits of the five bit RAG signal are applied as separate inputs to multiplexer 126 and the switching state of multiplexer 126 is controlled by the fifth RAG signal bit.

When the digitizer wants to write data into memory it transmits the REQ signal to the digitizer interface port 40 and the Q output of flip-flop 102 sets to provide an indicating signal to the state machine 100. When the state machine determines that the MMU is ready to process the data write request, the state machine transmits the SEND ADDR signal to the digitizer, to a latch control input of a latch 116, and to the latch control input of latch 112. The SEND ADDR signal causes the digitizer to place the address on the data/address bus and the trailing edge of the SEND ADDR signal causes latch 116 to latch the 16 bit memory address on the data/address bus from the digitizer onto an input of a summing circuit 114 and causes latch 112 to latch a base address from a RAG register addressed by the TAG signal onto another input of the summing circuit 114. The summing circuit combines the base address and the sixteen bit address from the digitizer to produce the eighteen bit address needed to address the waveform memory.

Thereafter the state machine 100 transmits the DATA ACK signal to the digitizer causing the digitizer to place the data to be written into memory on the data/address bus. The DATA ACK signal is also transmitted to a control input of a latch 110 and on the trailing edge of the DATA ACK signal latch 110 latches the data on the data/address bus onto the DIG DATA lines to the DRAM controllers. At the same time, the state machine 100 resets flip-flop 102. The DATA ACK signal output of state machine 100 also sets another flip-flop 104, the Q output of which is connected to inputs of a pair of AND gates 106 and 108. The A0 bit of the memory address produced by summing circuit 114 is applied to another input of AND gate 106 and the A0 bit is inverted by an inverter 107 and applied to another input of AND gate 108. AND gate 106 produces one of the two OREQ signal bits transmitted by the digitizer interface port to the odd DRAM controller, this one indicating that the digitizer interface port is requesting a memory write access. Similarly, AND gate 108 produces one of the two EREQ signal bits transmitted to the even DRAM controller, also to indicate that the digitizer interface port is requesting a memory write access.

When either the even or the odd DRAM controller grants a memory write access to the digitizer interface port, the controller transmits a WDIG signal to state machine 100 indicating that the write operation is in progress. The state machine then resets flip-flop 104 to terminate EREQ or OREQ signal output of AND gate 108 or 106 to the DRAM controller. When the data in the DIG DATA bus is subsequently stored in memory, the DRAM controller transmits an EOW signal to state machine 100 to indicate completion of the memory write operation.

Data sequences may be read out of the waveform memory and transmitted to the digitizer utilizing the addresses provided by the SAG generator of the microprocessor interface port of FIG. 5. When the first address of a sequence is placed on the SAG address lines from the microprocessor interface port to the DRAM controllers, the A0 bit of the SAG address is transmitted to the digitizer interface port 40 of FIG. 6 and applied as an input to an AND gate 130 and through an inverter 134 to an input of another AND gate 132. AND gate 130 produces another bit of the two bit OREQ signal transmitted to the odd DRAM controller indicating that the digitizer interface port is requesting a memory read operation while AND gate 132 produces the second bit of the two bit EREQ signal transmitted to the even DRAM controller to fulfill a similar purpose. When the state machine 100 detects the START signal from the microprocessor interface port, it asserts an output signal applied to additional inputs of both AND gate 130 and AND gate 132, and the state of SAG address bit A0 determines which AND gate produces a read request signal output. The even or odd DRAM controller receiving the read request signal grants the request by placing a data word from the memory location indicated by the SAG address on the 16 DIG DATA lines carrying data from the DRAM controllers to the digitizer via the address/data bus. The DRAM controller then transmits an end of word (EOW) signal to the state machine 100. In response to the EOW signal, state machine 100 transmits a SENT signal to the digitizer, causing the digitizer to read the data on the address/data bus.

The state machine 100 continues to assert its output signal to AND gates 130 and 132 so that the EREQ and OREQ signals continue to be sent to the DRAM controllers in an alternating fashion as the SAG address A0 bit changes state after each data read operation. When the microprocessor interface port generates the last address of a SAG sequence, it transmits the end of message (EOM) signal to state machine 100. Upon receipt of the first EOW signal following the EOM signal, the state machine deasserts its output signal to the AND gates 130 and 132 to turn off the request signals to the DRAM controllers.

Figure 7:
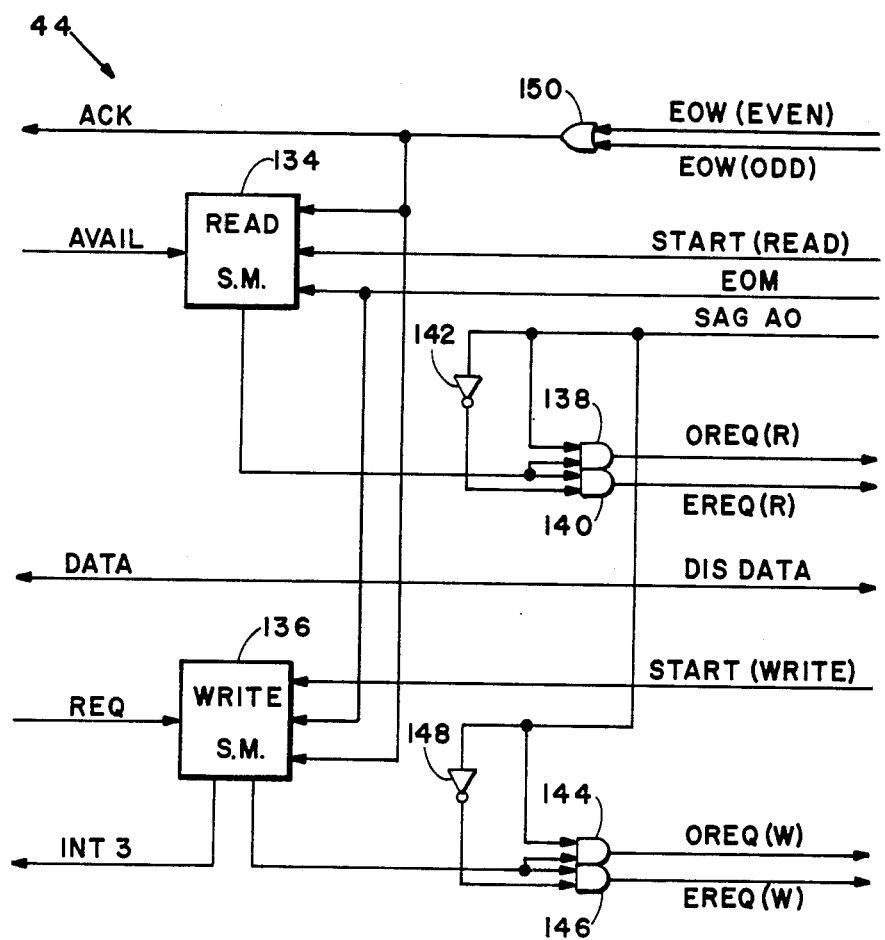
FIG. 7 is a more detailed block diagram of the display interface port of FIG. 4.

Referring to FIG. 7, depicting in block diagram form the display interface port 44 of FIG. 4, port 44 includes an asynchronous "read" state machine 134 for controlling data flow from the waveform memory 16 to the display controller 18 of FIG. 1 and an asynchronous "write" state machine 136 for controlling data flow from the display controller for writing to the waveform memory. The SAG addresses generated by the microprocessor interface port 42 of FIG. 5 are utilized to access the waveform memory for both read and write operations. The A0 bit of the SAG address, indicating whether the even or odd DRAM bank is to be accessed, is applied directly to inputs of AND gates 138 and 144 and indirectly, through inverters 142 and 148, to inputs of AND gates 140 and 146, respectively. The output of AND gate 138 is an OREQ signal to the odd DRAM controller indicating a memory read request while the output of AND gate 140 is an EREQ signal to the even DRAM controller also indicating a memory read request. The outputs of AND gates 144 and 146 are OREQ and EREQ signals, respectively, each conveying a memory write request to a DRAM controller.

When the display controller is free to receive data from memory, it asserts an AVAIL signal applied as input to state machine 134. Thereafter data transmission to the display controller may be initiated by a START signal from the microprocessor interface port also applied as an input to the state machine 134. On receipt of the START signal, the state machine 134 transmits a signal to inputs of AND gates 138 and 140 which signal causes one of the gates to initiate an OREQ or EREQ signal to a DRAM controller, depending on the state of the A0 SAG address bit generated by the microprocessor interface port. When the even or odd DRAM controller receiving the request grants the request (placing SAG addressed data on the data bus (DIS DATA) to the display controller), the DRAM controller generates an end of word (EOW) signal which is applied to an input of an OR gate 150. In response thereto, the OR gate 150 transmits the ACK signal to the display controller causing it to read the data on the bus. The ACK signal is also input to the read state machine 134 which deasserts the signal to the AND gates 138 and 140 to deassert the EREQ or OREQ signal and then monitors the AVAIL signal from the display controller. When the AVAIL signal is asserted, indicating that the display controller is ready to receive another data transmission, state machine 134 reasserts the signal to AND gates 138 and 140 to initiate another request. The process continues until the microprocessor interface port generates the last SAG address of the sequence, at which point the port transmits the end of message signal to the state machine 134. After detection of the next subsequent ACK signal output of OR gate 150, the state machine 134 stops initiating the OREQ and EREQ signals.

When the display controller wants to send data to the MMU for storage in the waveform memory, it places the data on its data bus to the MMU and asserts an REQ signal applied as input to write state machine 136. State machine 136 then transmits an interrupt signal (INT3) to the microprocessor telling the microprocessor to set up a SAG read operation. Thereafter, data transmission to the MMU is initiated by another START signal from the microprocessor interface port applied as input to the state machine 136. On receipt of the START signal, state machine 136 transmits a signal to inputs of AND gates 144 and 146 which causes one of these gates to initiate an OREQ or EREQ signal to an even or odd DRAM controller, depending on the state of the A0 SAG address bit. After the DRAM controller receiving the request grants the request by reading the data on the data bus from the display controller, the DRAM controller generates the end of word (EOW) signal applied to OR gate 150 and the OR gate transmits the ACK signal to the display controller causing it to place another data word on the data bus and to reassert the REQ signal. The ACK signal is also an input to state machine 136 and when the state machine detects the ACK signal it deasserts its output signal to the AND gates 144 and 146 to deassert the EREQ or OREQ signal and then monitors the REQ signal from the display controller. When the REQ signal is reasserted, indicating that the display controller is ready to send another data word, state machine 136 reasserts the signal to AND gates 144 and 146 to initiate another DRAM controller request. The process continues until the microprocessor interface port generates the last SAG address of the sequence, at which point it transmits the end of message (EOM) signal to the state machine 136. After detection of the next subsequent ACK signal, state machine 136 stops initiating the OREQ and EREQ signals.

Figure 8:
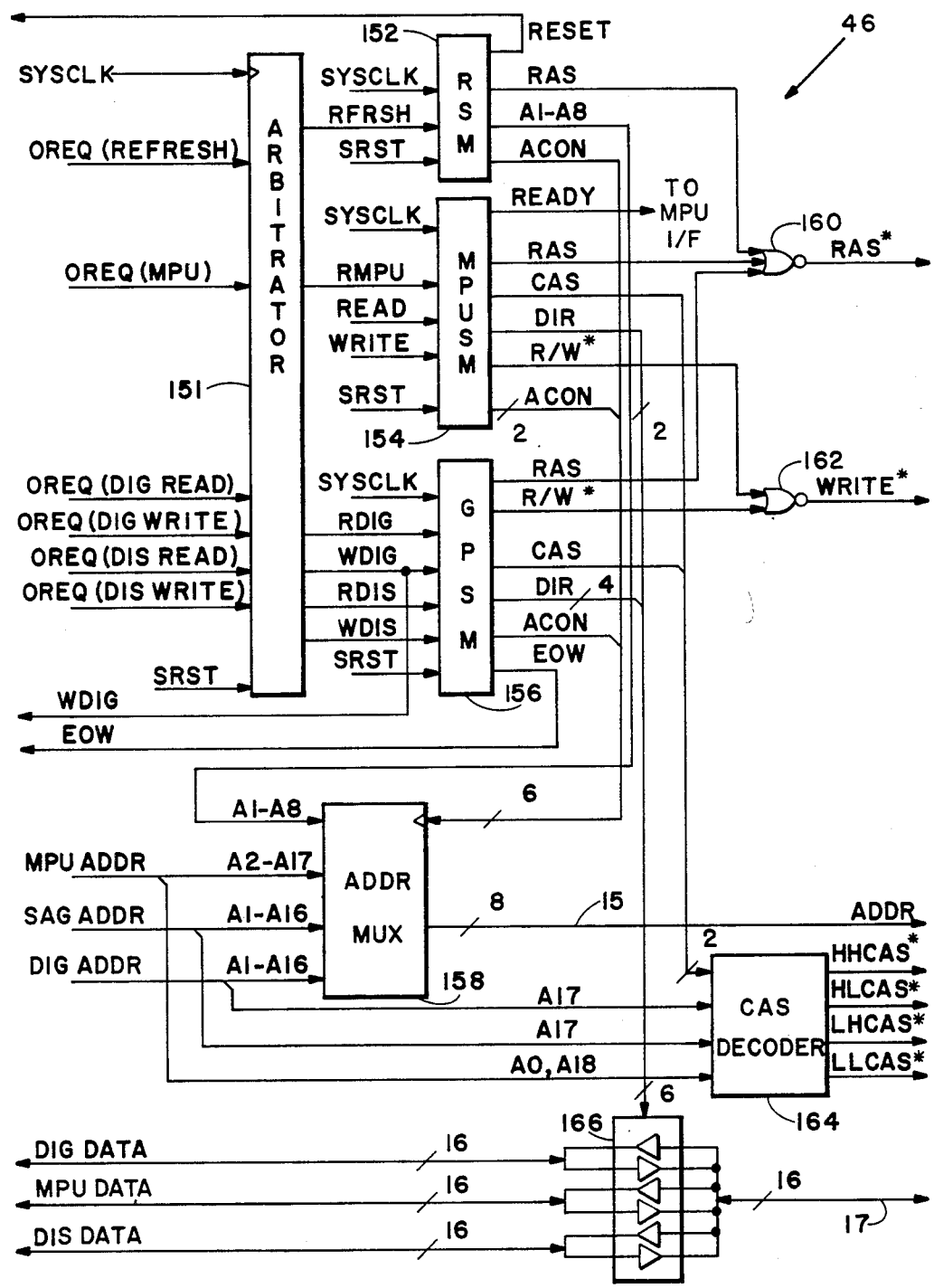
FIG. 8 is a more detailed block diagram of the odd DRAM controller of FIG. 4.

The odd and even DRAM controllers 46 and 48 of FIG. 4 are similar and only the odd DRAM controller 46 is discussed in detail herein. Referring to FIG. 8, depicting the odd DRAM controller 46 of FIG. 4 in block diagram form, the odd DRAM controller includes an arbitrator circuit 151 connected to receive the OREQ signals produced by the flip-flop 54, the digitizer interface port 40, the microprocessor interface port 42 and the display interface port 44 of FIG. 4. The arbitrator circuit 151 is a state machine, clocked by the SYSCLK signal and reset by a system reset signal SRST, and is adapted to generate one of a set of six memory access request output signals in response to the input request signals. One output request signal (RFRSH) is applied as input to a refresh state machine (RSM) 152 which initiates the refresh of the odd memory bank in response to the RFRSH input signal. Another request output signal (RMPU) of arbitrator 151 is applied as input to state machine (MPUSM) 154 which controls access to the odd memory bank for a read or write request from the microprocessor interface port 42 of FIG. 4. The remaining four request signals (RDIG, WDIG, RDIS, and WDIS) produced by the arbitrator circuit 151 drive inputs of a third state machine (GPSM) 156 which controls access to the odd memory bank in response to memory read and write requests from the digitizer and display interface ports 40 and 44 of FIG. 4. State machines 152, 154 and 156 are all clocked by the system clock SYSCLK and may be reset by the system reset signal SRST.

The MPU ADDR bits A2–A17 and SAG ADDR lines A1–A16 from the microprocessor interface port 42, the DIG ADDR lines A1–A16 from the digitizer interface port 40 of FIG. 4 and eight address lines A1–A8 from the refresh state machine 152 are applied as inputs to a 56×8 bit address multiplexer 158 which selectively transmits either the most significant or the least significant eight bits of one of the three sixteen bit input addresses or the eight bits of the address from the refresh state machine 152 on the address bus 15 connected to each DRAM chip of the odd DRAM bank 16a of FIG. 2. The A0 and A18 MPU ADDR bits, the A17 SAG ADDR bit, and the A17 DIG ADDR bit, along with CAS signals generated by state machines 154 and 156 provide inputs to a CAS signal decoder 164 which produces the HHCAS*, HLCAS*, LHCAS*, and LLCAS* signals for column address strobing the DRAM bank of FIG. 2 according to the states of the decoder inputs. The sixteen incoming and sixteen outgoing DIG DATA lines from the digitizer interface port, MPU data lines from the microprocessor interface port, and DS DATA lines from the display interface port are selectively connected to the data lines 17 of the odd DRAM bank 16a of FIG. 2 through a buffer circuit 166 acting as a bidirectional data multiplexer.

The arbitrator circuit 151 gives a refresh request highest priority. When it detects a refresh OREQ input signal, it transmits the RFRSH signal to refresh state machine 152 which subsequently transmits an address control signal (ACON) to address multiplexer 158 causing the multiplexer to select the eight address lines from the refresh state machine 152. The refresh state machine then transmits a sequence of memory addresses to odd DRAM bank 16a via multiplexer 158 and sends a sequence of RAS signals to a NOR gate 160, causing the NOR gate to assert the RAS* signal applied to each DRAM chip 32-39 in the odd memory bank 16a of FIG. 2 after each address change to refresh each DRAM chip.

The arbitrator circuit 151 gives an OREQ signal from the microprocessor interface port next highest priority. After receipt of an OREQ signal from the microprocessor interface port, in the absence of a refresh request, it transmits the RMPU signal to state machine 154. The READ and WRITE output signals of the microprocessor interface port 42 of FIG. 5 are also applied as inputs to state machine 154 to indicate whether the memory access is to be a read or a write operation and to indicate whether the access is for an eight bit or sixteen bit data word. On receipt of the RMPU signal, state machine 154 asserts or deasserts a write control R/W* signal output according to whether the WRITE and READ signal inputs indicate a write or a read operation. The R/W* signal is input to a NOR gate 162 which produces the WRITE* control signal applied to the odd DRAM bank. The state machine 154 also transmits an address control signal ACON to address multiplexer 158 which causes the multiplexer to place the eight least significant bits on the MPU ADDR lines on the ADDR bus 15 to the odd DRAM bank and then asserts a RAS output signal applied to an input of NOR gate 160 to initiate the RAS* signal which row address strobes the DRAM bank. The state machine 154 then switches the address multiplexer 158 to place the eight most significant address bits of the MPU ADDR lines on the odd DRAM bank address bus 15 and transmits one of two single bit direction control signals (DIR) to buffer circuit 166 causing the buffer circuit to connect the MPU DATA bus to the DRAM data bus 17 for either a data read or write transmission. The data flow direction is determined by the states of the READ and WRITE inputs to the state machine 154. The state machine 154 then transmits a CAS signal to CAS decoder 164. The CAS signal, in combination with the state of the A0 and A18 bit, causes the CAS decoder 164 to generate the appropriate one or two CAS* output signals required to column address strobe the eight or sixteen bit memory storage location being accessed by the microprocessor. If the WRITE* signal output of state machine 154 is asserted, the odd DRAM bank then responds by reading the eight or sixteen bit data from memory onto the data bus 17 and if the WRITE* signal is not asserted, the odd DRAM bank responds by writing the eight or sixteen bit data on the data bus 17 into memory. After asserting the CAS signal, the state machine 154 transmits the READY signal to the microprocessor interface port 42 of FIG. 5 to indicate, in the case of a memory read operation, that data has been placed on the data bus, or to indicate, in the case of a memory write operation, that the data has been written into memory.

When state machine 156 receives an RDIG signal, it transmits an address control output signal ACON to the address multiplexer 158 which causes the address multiplexer to place the lower order eight bits on the DIG ADDR lines on the ADDR bus to the odd DRAM bank and asserts an R/W* output signal to NOR gate 162, causing the NOR gate to deassert the WRITE* signal. State machine 156 then transmits a RAS signal to NOR gate 160 causing it to assert the RAS* signal to row address strobe the odd DRAM bank. Thereafter state machine 156 switches the state of address multiplexer 158 to place the eight highest address bits on the DIG ADDR lines on the ADDR lines 15 to the odd DRAM bank, transmits one of four single bit DIR signals to buffer 166 to connect the DIG DATA lines to the DRAM DATA bus 17 for a data read operation, and then asserts a CAS signal input to the CAS decoder 164, causing the CAS decoder to assert either the HHCAS* and HLCAS* signals or the LHCAS* and LLCAS* signals as determined by the state of the A17 bit on the DIG ADDR bus. The output of CAS decoder 164 column address strobes the odd DRAM bank, whereby the DRAM bank places the addressed data on the DATA bus 17. The state machine 156 then transmits an end of word (EOW) signal to the digitizer interface port 40 of FIG. 4 indicating that the data is on the bus.

When state machine 156 receives an RDIS, RDIG or WDIG signal, it transmits an address control output signal ACON to the address multiplexer 158 and the address multiplexer places the lower order eight bits on the SAG ADDR bus on the ADDR bus 15 to the odd DRAM bank. If the RDIS signal was received, state machine 156 asserts an R/W* output signal to NOR gate 162, whereby the NOR gate deasserts the WRITE* signal. State machine 156 then transmits its RAS output signal to NOR gate 160 and NOR gate 160 asserts the RAS* signal to row address strobe the odd DRAM bank. Thereafter state machine 156 switches the state of address multiplexer 158 to place the eight highest address bits on the SAG ADDR lines on the ADDR bus 15 to the odd DRAM bank. State machine 156 then transmits the appropriate one of four of its single bit output DIR signals to buffer 166 to connect either the DIG DATA or the DIS lines (depending on whether an RDIS, RDIG or WDIG signal was asserted) to the DRAM bank DATA bus 17 for the indicated data read or data write operation, and asserts a CAS signal input to the CAS decoder 164, causing the CAS decoder to assert either the HHCAS* and HLCAS* signals or the LHCAS* and LLCAS* signals, as determined by the state of the A17 bit on the SAG ADDR lines also applied as input to the CAS decoder. The output of CAS decoder 164 column address strobes the appropriate chips in the odd DRAM bank, prompting the DRAM bank to read or write the data on the odd DRAM bank DATA bus. The state machine 156 then transmits an end of word (EOW) to the digitizer and display interface ports 40 and 44 of FIG. 4 indicating that the data is on the DATA bus 17 (in the case of a read request) or that the data has been written to memory (in the case of a write request).

Referring to FIGS. 1 and 4, the separation of the waveform memory into independently accessible odd and even banks 16a and 16b, and the use of DRAM controllers 46 and 48 to independently access each bank, permits two data processing devices such as display controller 18, microprocessor 24 or digitizer 12 to access the waveform memory 16 at the same time. When, for example, digitizer 12 and microprocessor 24 each attempt to write sequences of waveform data into the waveform memory 16 at the same time, the even and odd DRAM controllers in MMU 14 arbitrate access to the banks in an alternating fashion such that during one memory access cycle, the microprocessor writes a data word to an odd address in the odd bank while the digitizer writes a data word to an even address in the even bank. During a next memory access cycle, the microprocessor writes the next word of its data sequence to an even address in the even bank while the digitizer writes the next data word of its data sequence to an odd memory address in the odd bank. Thus each processing device is able to read or write a data sequence to sequential memory addresses without substantially interfering with the rate at which the other device reads or writes a data sequence out of or into the memory.

The preferred embodiment of the invention is adapted for use in conjunction with the digital oscilloscope depicted in FIG. 1 including the microprocessor 24, the digitizer 12, and the display controller 18. The microprocessor generates its own addressing for either waveform memory read or write operations. The digitizer 12 generates addresses for memory write operations but utilizes the sequential address generator (SAG) in MMU 14 for providing addresses for memory read operations. The display controller 18 requires SAG addressing for both memory read and write operations. Since only one SAG is provided in MMU 14 in the preferred embodiment of the invention, the display controller 18 cannot access the waveform memory for either a read or a write operation at the same time digitizer 12 read accesses the waveform memory. However this is not a serious limitation in the system of FIG. 1 since the digitizer 12 reads control data from the waveform memory only infrequently and therefore requires use of the SAG only infrequently. In alternative applications for the invention, where concurrent access to the memory by more than one device utilizing the sequential address generation capability of the MMU is advantageous, additional sequential address generators may be provided within MMU 14.

While in the preferred embodiment of the invention the waveform memory 16 has been divided into two banks, in alternative embodiments of the invention the waveform memory may be divided into more banks. For example the waveform memory be divided into four banks each occupying a separate memory space determined by the two least significant bits of the memory address, rather than the single least significant bit. In such an alternative embodiment of the invention, four DRAM controllers such as DRAM controllers 46 and 48 of FIG. 4 would be provided and each interface port would include circuitry to direct request signals to the appropriate DRAM controller based on the state of the two least significant address bits, thereby permitting four processing devices to access the memory at the same time.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A system for providing concurrent access to an addressable memory space having consecutive memory addresses by a plurality of data processing devices, comprising:

N independently accessible memory banks, each memory bank providing a separate portion of said addressable memory space, wherein each separate portion of said addressable space consists of every Nth one of said consecutive memory addresses and N is an integer having a value greater than one;

port means for communicating with said data processing devices for providing a memory bank address for each memory bank access by each data processing device, and for generating indicating signals indicating which of said memory banks each data processing device is to access in accordance with a value of the memory bank address provided;

a plurality of address multiplexing means, each corresponding to a separate one of said memory banks, and each for providing an address for accessing the corresponding memory bank, the address being selected from among said addresses provided by said port means;

a plurality of data multiplexing means, each corresponding to a separate one of said memory banks, and each for completing a data path between the corresponding memory bank and any selected one of said data processing device; and controller means for generating control signals for controlling the operation of each memory bank during each memory bank access and for controlling each address multiplexing means and each data multiplexing means according to said indicating signals generated by said port means.

2. The system according to claim 1 wherein said controller means comprises arbitration means responsive to said indicating signals for determining which of said data processing devices is to access each memory bank at any given time.

3. The system according to claim 1 wherein said port means includes a sequential address generator for generating a sequence of said memory bank addresses, said sequential address generator comprising:
   means for storing a base address;
   means for maintaining a count of the number of times said memory banks are addressed by a memory address of said sequence of memory bank addresses; and
   means for adding said base address to said count to generate each memory bank address of said sequence of memory bank addresses.

4. A digital oscilloscope comprising:
   N independently accessible memory banks, each memory bank for providing a separate portion of an addressable memory space having consecutive memory addresses, wherein each separate portion of said addressable space consists of every Nth one of said consecutive memory addresses and N is an integer having a value greater than one;
   digitizer means for producing a sequence of sampled waveform data to be stored in said addressable memory space;
   processing means for generating a sequence of processed waveform data to be stored in said addressable memory space; and
   memory management means for providing random access to any one of said memory banks for said digitizer means while providing concurrent random access to any other of said memory banks for said processing means so that the sequence of sampled waveform data occurs in consecutive memory addresses of the addressable memory space.

5. A digital oscilloscope comprising:
   N independently accessible memory banks, each memory bank providing a separate portion of an addressable memory space, wherein each separate portion of said addressable space consists of every Nth one of said consecutive memory addresses and N is an integer having a value greater than one;
   digitizer means for producing a sequence of sampled waveform data to be stored in said addressable memory space;
   a screen for displaying waveform images;
   display controller means for displaying waveform images on said screen based on sampled waveform data sequences stored in said addressable memory space on said screen; and
   memory management means for providing random access to one of said memory banks for one of said digitizer and display controller means while providing concurrent random access to any other of said memory banks for the other of said digitizer and display controller means so that the sequence of sampled waveform data occurs in consecutive memory addresses of the addressable memory space.

6. The digital oscilloscope according to claim 5 wherein said memory management means comprises:
   port means for communicating with said digitizer and display controller means, for providing a memory bank address for each memory bank access by each of said digitizer and display controller means, and for generating indicating signals indicating which of said memory banks each of said digitizer and display controller means is to access in accordance with a value of the memory bank address provided;
   a plurality of address multiplexing means, each corresponding to a separate one of said memory banks, and each for providing an address for accessing the corresponding memory bank, the address being selected from among said addresses provided by said port means;
   a plurality of data multiplexing means, each corresponding to a separate one of said memory banks, and each for completing a data path between the corresponding memory bank and any selected one of said digitizer and display controller means; and
   controller means for generating control signals for controlling the operation of each memory bank during each memory bank access and for controlling each address multiplexing means and each data multiplexing means according to said indicating signals generated by said port means.

7. The digital oscilloscope according to claim 6 wherein said port means includes a sequential address generator for generating a sequence of said memory bank addresses, said sequential address generator comprising:
   means for storing a base address;
   means for maintaining a count of the number of times said memory banks are addressed by a memory address of said sequence of memory bank addresses; and
   means for adding said base address to said count to generate each memory bank address of said sequence of memory bank addresses.

8. An improved digital oscilloscope of the type having a digitizer for converting an input analog signal to digital data words, a waveform memory to store the digital data words, and a display controller for displaying the digital data from the waveform memory on a display, all under control of a microprocessor, wherein the improvement comprises:
   means for addressing the waveform memory as a plurality of memory banks;
   means for accessing each memory bank simultaneously by at least two processing units taken from the set including the digitizer, the microprocessor and the display controller; and
   means for alternating data accesses to the memory banks between each of the processing units so that the data for each processing unit occurs in sequential data addresses of the waveform memory.

9. An improved digital oscilloscope as recited in claim 8 further comprising means for arbitrating between the processing units when more than one processing unit seeks to access the same memory bank.

* * * * *